United States Patent [19]
Sanjurjo

[11] Patent Number: 5,149,514
[45] Date of Patent: Sep. 22, 1992

[54] LOW TEMPERATURE METHOD OF FORMING MATERIALS USING ONE OR MORE METAL REACTANTS AND A HALOGEN-CONTAINING REACTANT TO FORM ONE OR MORE REACTIVE INTERMEDIATES

[75] Inventor: Angel Sanjurjo, San Jose, Calif.

[73] Assignee: SRI International, Menlo Park, Calif.

[21] Appl. No.: 654,395

[22] Filed: Feb. 8, 1991

Related U.S. Application Data

[63] Continuation of Ser. No. 333,180, Apr. 4, 1989, abandoned.

[51] Int. Cl.$^5$ .................... C01B 21/068; C01B 21/06; C01B 31/30; C01B 13/22
[52] U.S. Cl. ........................................ 423/344; 75/343; 75/366; 423/289; 423/297; 423/346; 423/409; 423/411; 423/412; 423/439; 423/440; 423/592; 423/606; 423/607; 423/608; 423/625; 427/249; 427/253; 427/255.2; 427/255.3
[58] Field of Search ............... 423/344, 346, 409, 411, 423/412, 439, 440, 592, 606, 607, 608, 625

[56] References Cited

U.S. PATENT DOCUMENTS

| | | | |
|---|---|---|---|
| 2,830,888 | 4/1958 | Wade | 423/492 |
| 3,233,966 | 2/1966 | Cooper et al. | 423/492 |
| 3,304,249 | 2/1967 | Katz | 423/DIG. 16 |
| 3,488,143 | 1/1970 | Wendell et al. | 423/492 |
| 3,959,446 | 5/1976 | Mazdiyasni et al. | 423/344 |
| 3,979,500 | 9/1976 | Sheppard et al. | 423/344 |
| 4,399,115 | 8/1983 | Sato et al. | 423/344 |
| 4,416,863 | 11/1983 | Sato et al. | 423/344 |
| 4,452,767 | 6/1984 | Brynestad et al. | 423/297 |
| 4,503,021 | 3/1985 | Brynestad et al. | 423/492 |
| 4,572,902 | 2/1986 | Matano et al. | 501/97 |
| 4,623,400 | 11/1986 | Japka et al. | 148/6.35 |
| 4,812,301 | 3/1989 | Davidson et al. | 423/440 |

FOREIGN PATENT DOCUMENTS

| | | |
|---|---|---|
| 2309648 | 4/1975 | European Pat. Off. |
| 0068950 | 6/1982 | European Pat. Off. |
| 0214489 | 8/1986 | European Pat. Off. |

OTHER PUBLICATIONS

Patent Abstracts of Japan, Publication No. 62070529.
Patent Abstracts of Japan, Publication No. 62294175.
Patent Abstracts of Japan, Publication No. 01056872.
Jennings, H. M., "Review on Reactions between Silicon and Nitrogen", *Journal of Materials Science*, vol. 18, 1963, pp. 951-967.
Mazdiyasni, K. S., et al., "Synthesis, Characterization, and Consolidation of $Si_3N_4$ Obtained from Ammonolysis of $SiCl_4$", *Journal of the American Ceramic Society*, vol. 56, No. 12, 1973, pp. 628-633.
Pugar, Eloise A., et al., "Low Temperature Direct Reactions Between Elemental Silicon and Liquid Ammonia or Amines for Ceramics and Chemical Intermediates", *Materials Research Society Symposium Proceedings*, vol. 121, 1988, pp. 439-447.
Stinton, David P., et al., "Advanced Ceramics by Chemical Vapor Deposition Techniques", *Ceramic Bulletin*, vol. 67, No. 2, 1988, pp. 350-355.

Primary Examiner—Wayne A. Langel
Attorney, Agent, or Firm—John P. Taylor

[57] ABSTRACT

A low temperature process is described for forming a coating or powder comprising one or more metals or metal compounds by first reacting one or more metal reactants with a halide-containing reactant to form one or more reactive intermediates capable of reacting, disproportionating, or decomposing to form a coating or powder comprising the one or more metal reactants. When one or more metal compounds are formed, either as powders or as coatings, a third reactant may be injected into a second reaction zone in the reactor to contact the one or more reactive intermediates formed in the first reaction zone to thereby form one or more metal compounds such as metal nitrides, carbides, oxides, borides, or mixtures of same.

7 Claims, 7 Drawing Sheets

```
REACTING ONE OR MORE METAL
REACTANTS WITH A HALOGEN-
CONTAINING REACTANT AT A LOW
TEMPERATURE TO FORM ONE OR
MORE REACTIVE INTERMEDIATES
IN A MOVING BED REACTOR
```

```
FORMING A POWDER COMPRISING THE
ONE OR MORE METAL REACTANTS BY
REACTION, DISPROPORTIONATION,
OR DECOMPOSITION OF THE ONE OR
MORE REACTIVE INTERMEDIATES
```

FIG. 1

```
REACTING ONE OR MORE METAL
REACTANTS WITH A HALOGEN-
CONTAINING REACTANT AT A LOW
TEMPERATURE TO FORM ONE OR
MORE REACTIVE INTERMEDIATES
IN A MOVING BED REACTOR
```

```
FORMING A COATING ON A SUBSTRATE
COMPRISING THE ONE OR MORE METAL
REACTANTS BY DISPROPORTIONATION,
REACTION, OR DECOMPOSITION OF THE
ONE OR MORE REACTIVE INTERMEDIATES
```

FIG. 2

REACTING ONE OR MORE METAL REACTANTS WITH A HALOGEN-CONTAINING REACTANT AT A LOW TEMPERATURE IN A FIRST REACTION ZONE TO FORM ONE OR MORE REACTIVE INTERMEDIATES IN A MOVING BED REACTOR

REACTING THE ONE OR MORE REACTIVE INTERMEDIATES WITH A THIRD REACTANT IN A SECOND REACTION ZONE TO FORM A POWDER COMPRISING A NITRIDE, CARBIDE, OXIDE, OR BORIDE OF THE ONE OR MORE METAL REACTANTS OR A MIXTURE OF SAME

FIG. 3

REACTING ONE OR MORE METAL REACTANTS WITH A HALOGEN-CONTAINING REACTANT AT A LOW TEMPERATURE IN A FIRST REACTION ZONE TO FORM ONE OR MORE REACTIVE INTERMEDIATES IN A MOVING BED REACTOR

REACTING THE ONE OR MORE REACTIVE INTERMEDIATES WITH A THIRD REACTANT IN A SECOND REACTION ZONE TO FORM A COATING ON A SUBSTRATE COMPRISING A NITRIDE, CARBIDE, OXIDE, OR BORIDE, OF THE ONE OR MORE METAL REACTANTS OR A MIXTURE OF SAME

FIG. 4

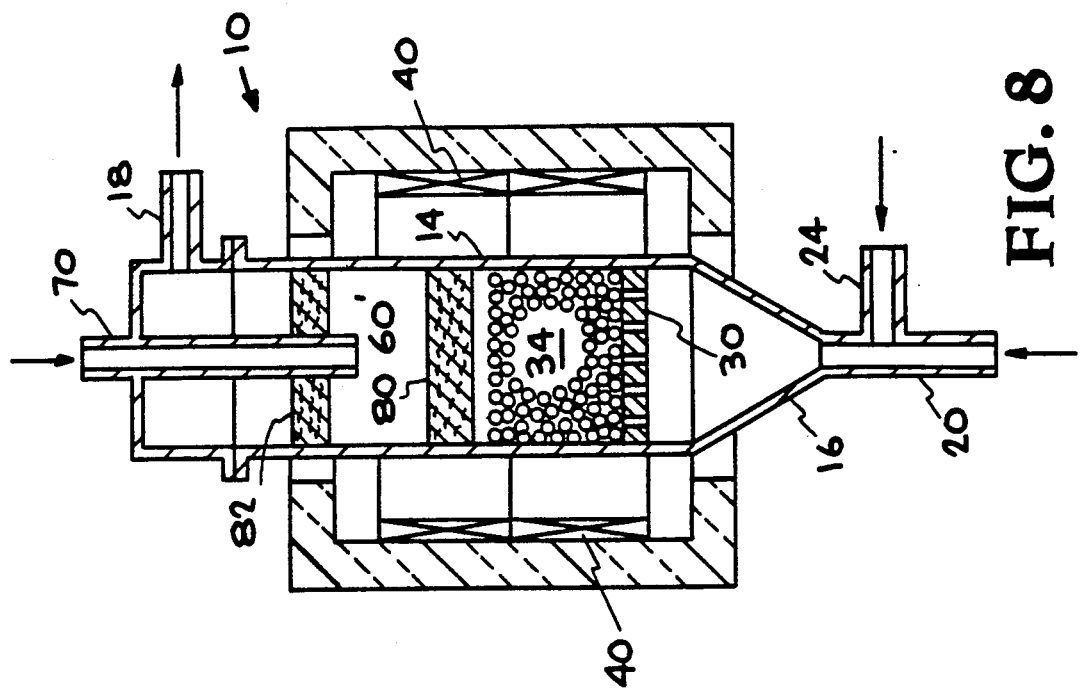
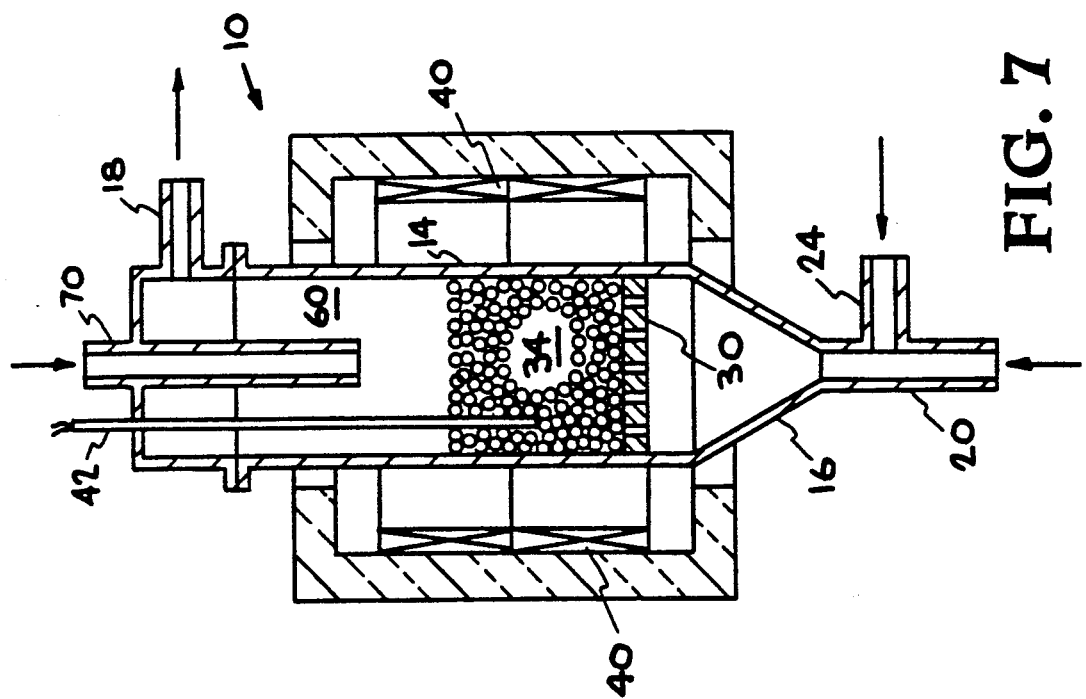

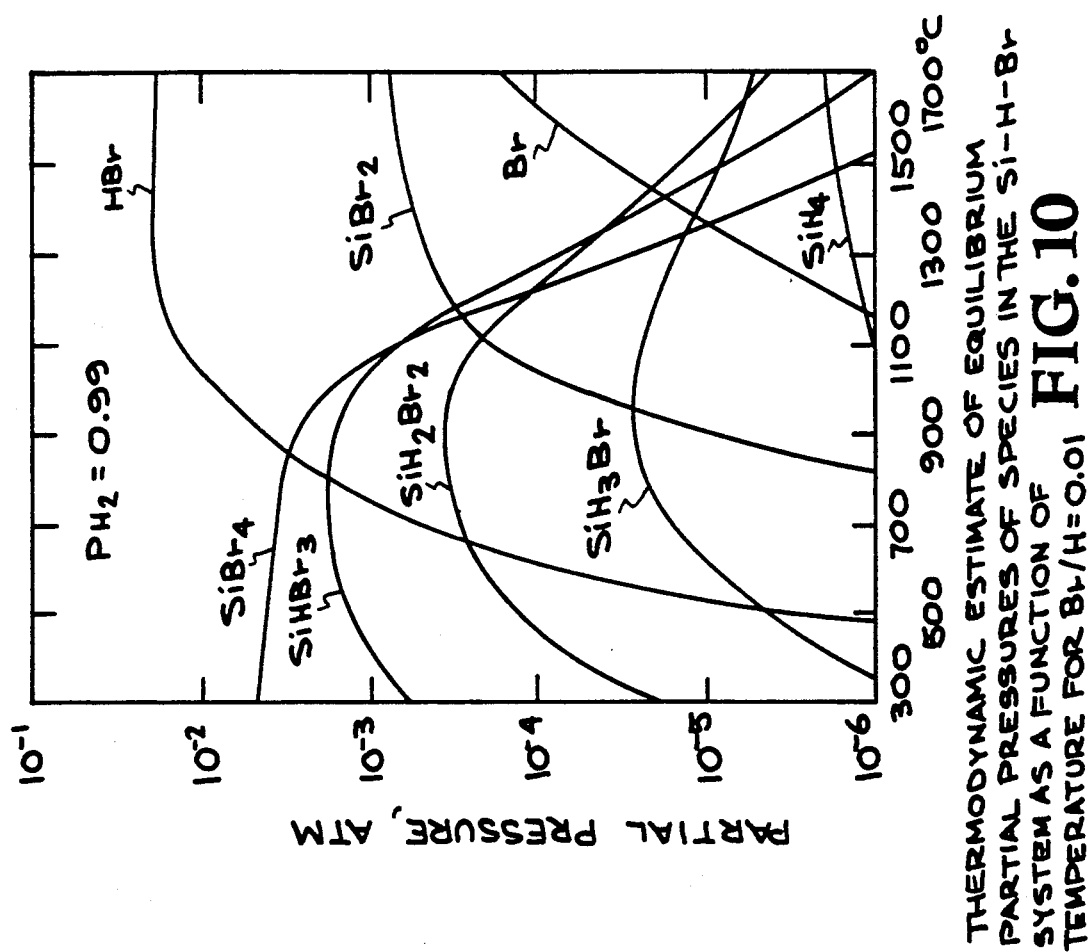
FIG. 10 THERMODYNAMIC ESTIMATE OF EQUILIBRIUM PARTIAL PRESSURES OF SPECIES IN THE Si-H-Br SYSTEM AS A FUNCTION OF TEMPERATURE FOR Br/H=0.01
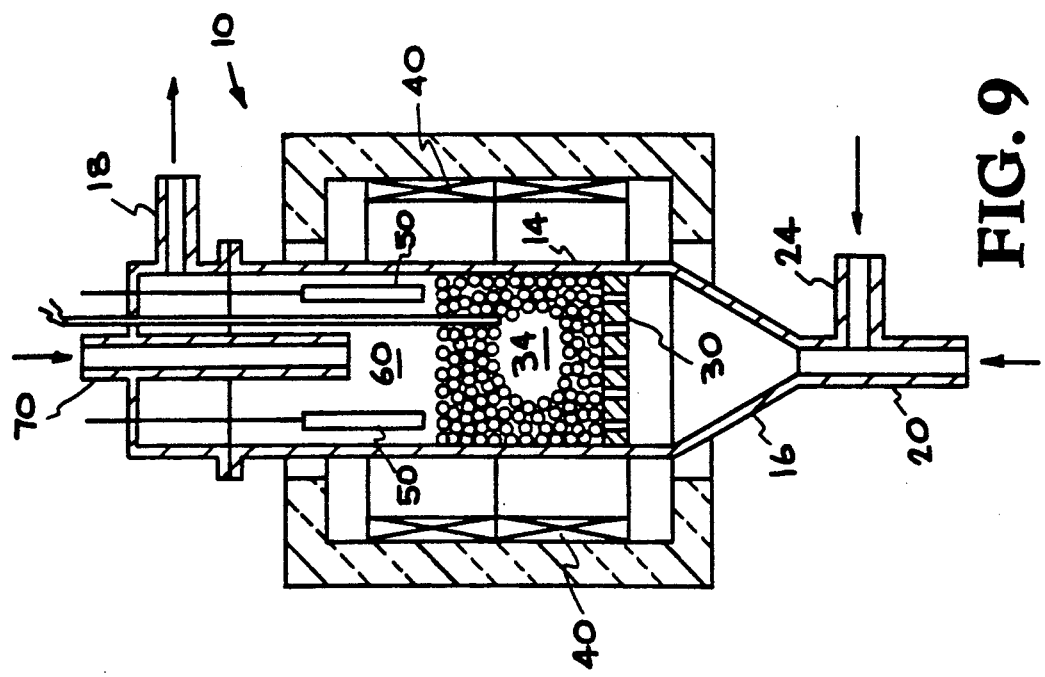
FIG. 9

LOW TEMPERATURE METHOD OF FORMING MATERIALS USING ONE OR MORE METAL REACTANTS AND A HALOGEN-CONTAINING REACTANT TO FORM ONE OR MORE REACTIVE INTERMEDIATES

This is a continuation of copending application Ser. No. 07/333,180, filed on Apr. 4, 1989, abandoned.

BACKGROUND OF THE INVENTION

1. Field of the Invention

This invention relates to the production of materials in the form of coatings or powders using a halogen-containing reactant which will react with a second reactant to form one or more reactive intermediates from which the powder or coating may be formed by disproportionation, decomposition, or reaction. In one embodiment, the powder or coating is formed directly from the one or more reactive intermediates. In a second embodiment, the one or more reactive intermediates react with a gaseous third reactant resulting in the formation of a powder or coating.

2. Description of the Related Art

Metallic and ceramic powders and coatings can be formed by a variety of techniques including vapor deposition, chemical vapor deposition (CVD), sputtering, dip coating, slurry painting, pack cementation, thermal spraying, grinding, milling, etc. Each technique has some advantages and disadvantages that dictate their major area of applications.

For example, when a powder of a particular material is to be formed, the material may be milled or ground. However, when the desired powder is an element such as aluminum, silicon, titanium, etc., such milling or grinding may require implementation of additional safety requirements. Additionally, the formation of powders from compounds usually requires additional steps to produce the compound from which the powder will be formed.

When a coating of a particular material is desired, the material may be applied as a vapor by first volatilizing the material, which may in some cases require very high temperatures, e.g. as high as 2000° C. or higher for materials such as silicon and titanium, or the coating may be applied by other means mentioned above such as sputtering, coating, painting, or spraying which, while not requiring as high a temperature as the vaporization techniques, may not form a bond which is as satisfactory.

Stinton et al in "Advanced Ceramics by Chemical Vapor Deposition Techniques", *Ceramic Bulletin*, Volume 67, No. 2 (1988), pages 350-355, describes the use of CVD techniques to form a number of carbides, nitrides, oxides, and borides of various metals.

When a coating of a compound is desired, CVD is particularly well suited for many applications including deposition of semiconductor and metallic interconnects, deposition of hard coatings for tools and gears, and deposition of corrosion resistant coatings for aqueous and high temperature environments, Typically a gas mix such as, for example, $TiCl_4$ and $NH_3$ are passed over a substrate heated to high temperature, (>1000° C.) so that a film of TiN, which is formed in situ, deposits on the substrate.

Some of the factors which limit the use of CVD are cost (capital equipment cost and operating cost), and, in some cases, the need to operate at high temperatures that may degrade the properties of the substrate. Another limitation of CVD, in some cases, may be the difficulty in maintaining constant temperature on the substrate and constant composition of the gas phase, especially if the substrate has a convoluted geometry.

To reduce the effects of these disadvantages and limitations, improvement have been proposed in the past such as, for example, the use of plasma assisted CVD. Unfortunately, the use of such plasma assisted CVD requires working at low pressures which results in higher coating costs.

Other improvements aimed at improving the homogeneity of the coatings consisted of modifying the flowdynamics of the gas around the piece to be coated and careful design of the heating unit. Such approaches can result in expensive, one-of-a-kind systems, and low utilization of the reactants.

Another approach is described in Japka et al U.S. Pat. No. 4,623,400 wherein a gas mix containing vapors of the coating precursor is injected into a fluidized bed containing inert particles. The piece to be coated is immersed in the bed. The use of a flowing bed reactor (FBR) with its fast heat transfer permits the piece to be coated to be maintained at a uniform temperature by the bed, resulting in a more uniform coating. Unfortunately, in this process, much of the coating material is deposited on the inert fluidized bed particles and the reaction requires expensive reactants.

Using silicon as an example, when it is desired to form a powder compound such as silicon nitride or silicon carbide, it is not usually possible to form such compounds directly from silicon without the use of high temperatures. For example, Jennings, in an article entitled "On Reactions Between Silicon and Nitrogen", published in the *Journal of Materials Science*, Volume 18, (1963), pages 951-967, states that typical nitriding involves heating silicon, usually a powder compact, and nitrogen to temperatures between 1300° and 1500° C., although Pugar et al, in an article entitled "Low Temperature Direct Reactions Between Elemental Silicon and Liquid Ammonia or Amines for Ceramics and Chemical Intermediates", *Materials Research Society Symposium Proceedings*, Volume 21, 1988, pages 439-447, reports direct reactions between elemental silicon and either ammonia or hydrazine at low temperatures.

In the prior art, however, it has been conventional to use more reactive materials such as silicon halides or silanes as the source of silicon for forming silicon compounds such as silicon nitride, silicon carbide, etc. For example, Mazdiyasni et al U.S. Pat. No. 3,959,446 describes a process for producing silicon nitride powder using liquid silicon tetrachloride and ammonia as the initial reactants to form a mixture of silicon diimide and ammonium chloride which is then heated under a vacuum of from $10^{-3}$ to $10^{-4}$ torr to a temperature of 1200° to 1350° C. to form the silicon nitride from this intermediate.

Similarly, when a coating is to be formed comprising a compound, e.g., of silicon nitride or titanium carbide, it is necessary to both form the compound as well as provide a means for depositing or forming the coating on a substrate.

It would, therefore, be desirable to provide a process wherein powders or coatings comprising either a single element, or the reaction product of an element with another reactant, could be formed without the need for use of expensive reactants and/or high temperatures and/or pressures and the need for carefully controlled reaction conditions.

SUMMARY OF THE INVENTION

It is, therefore, an object of this invention to provide a low temperature process for forming a coating or powder comprising one or more metals or metal compounds by reacting the one or more metals with a halide-containing reactant in a moving bed reactor to form one or more reactive intermediates capable of forming a coating or powder with or without reaction with another material.

It is another object of this invention to provide a low temperature process for forming a coating or powder comprising one or more metals by reacting the one or more metals with a halide-containing reactant in a moving bed reactor to form one or more unstable reactive intermediates capable of disproportionating, decomposing, or reacting to form a coating or powder of the one or more metals.

It is yet another object of this invention to provide a low temperature process for forming on a substrate a coating comprising one or more metals by reacting the one or more metals with a halide-containing reactant in a moving bed reactor to form one or more unstable reactive intermediates capable of disproportionating, decomposing, or reacting to deposit a coating of the one or more metals on the substrate.

It is still another object of this invention to provide a low temperature process for forming a powder comprising one or more metals by reacting the one or more metals with a halide-containing reactant in a first reaction zone of a moving bed reactor to form one or more unstable reactive intermediates capable of disproportionating, decomposing, or reacting in a second zone of the reactor to form a powder of the one or more metals.

It is a further object of this invention to provide a low temperature process for forming a coating or powder comprising one or more metal compounds by reacting one or more metals with a halide-containing reactant in a moving bed reactor to form one or more reactive intermediates capable of disproportionating, decomposing, or reacting with another reactant to form a coating or powder comprising one or more metal compounds of the one or more metal reactants.

It is a yet further object of this invention to provide a low temperature process for forming a coating or powder comprising one or more metal compounds by reacting one or more metals with a halide-containing reactant in a first zone of a moving bed reactor to form one or more reactive intermediates which then disproportionate, decompose, or react, in a second zone of the reactor, with another reactant selected from the class consisting of a boron-containing reactant, a carbon-containing reactant, a nitrogen-containing reactant, an oxide-containing reactant, and mixtures thereof to form a coating or powder comprising, respectively, one or more metal borides, carbides, nitrides, oxides, or a mixture thereof, of the one or more metal reactants depending upon the other reactant.

It is still a further object of this invention to provide a low temperature process for forming on a substrate a coating comprising one or more compounds of one or more metals by reacting the one or more metals with a halide-containing reactant, in a first zone of a moving bed reactor, to form one or more reactive intermediates which then disproportionate, decompose, or react, in a second zone of the reactor, with another reactant selected from the class consisting of a boron-containing reactant, a carbon-containing reactant, a nitrogen-containing reactant, an oxide-containing reactant, and mixtures thereof to deposit on the substrate a coating of one or more metal compounds comprising, respectively, one or more metal borides, metal carbides, metal nitrides, metal oxides, or a mixture thereof, of the one or more metal reactants depending upon the other reactant.

It is another object of this invention to provide a low temperature process for forming a powder comprising one or more compounds of one or more metals by reacting the one or more metals with a halide-containing reactant in a first zone of a moving bed reactor to form one or more reactive intermediates which then disproportionate, decompose, or react, in a second zone of the reactor, with another reactant selected from the class consisting of a boron-containing reactant, a carbon-containing reactant, a nitrogen-containing reactant, an oxygen-containing reactant, and mixtures thereof to form a powder comprising, respectively, one or more metal borides, metal carbides, metal nitrides, metal oxides, or a mixture thereof, of the one or more metal reactants depending upon the other reactant.

These and other objects of the invention will be apparent from the following description and accompanying illustrations.

BRIEF DESCRIPTION OF THE DRAWINGS

FIG. 1 is a flow sheet illustrating a first embodiment of the process of the invention.

FIG. 2 is a flow sheet illustrating a second embodiment of the process of the invention.

FIG. 3 is a flow sheet illustrating a third embodiment of the process of the invention.

FIG. 4 is a flow sheet illustrating a fourth embodiment of the process of the invention.

FIG. 7 is a vertical cross section view of a moving bed reactor showing the formation of a powder comprising one or more metal compounds by reaction with a third reactant, in a second zone, of one or more reactive intermediates formed by reacting one or more metal reactants with a halogen-containing reactant.

FIG. 8 is a vertical cross section view of a moving bed reactor showing the formation of a coating on graphite fibers of one or more metal compounds by reaction with a third reactant, in a second zone, of one or more reactive intermediates formed by reacting one or more metal reactants with a halogen-containing reactant.

FIG. 9 is a vertical cross section view of a moving bed reactor showing the formation of a coating on steel plates of one or more metal compounds by reaction with a third reactant, in a second zone, of one or more reactive intermediates formed by reacting one or more metal reactants with a halogen-containing reactant.

FIG. 10 is a graph showing the thermodynamic estimate of equilibrium partial pressures of species in the Si-H-Br system as a function of temperature for Br/H=0.01.

DETAILED DESCRIPTION OF THE INVENTION

Figure 6:
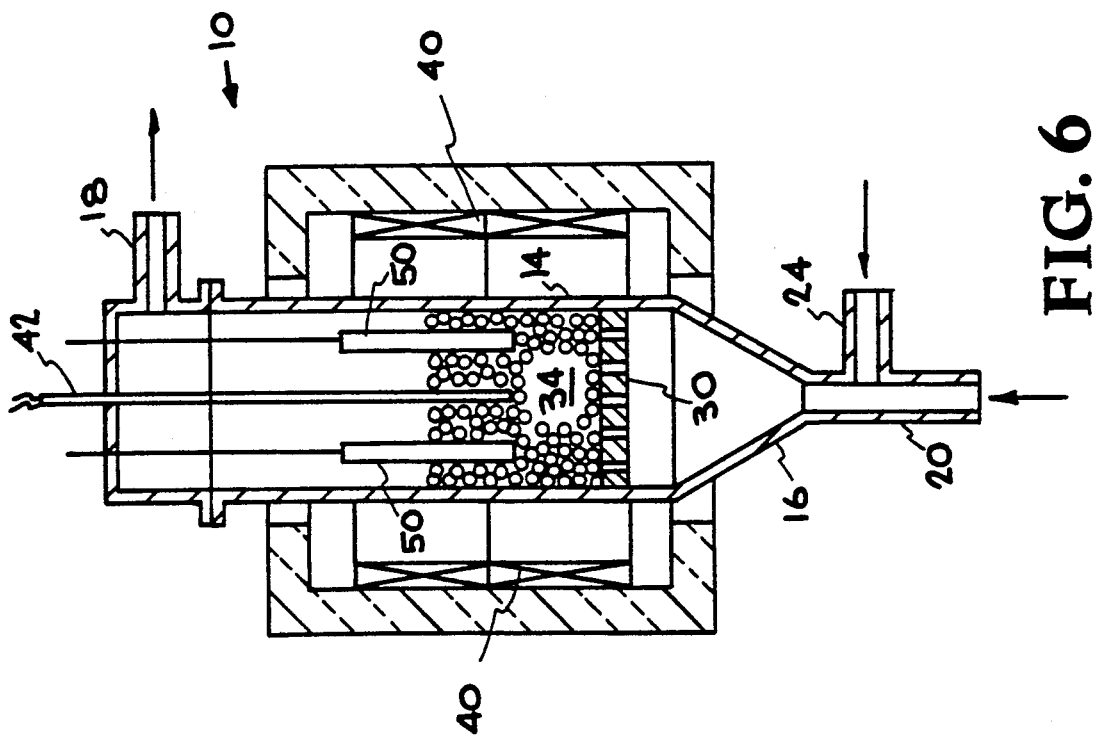
FIG. 6 is a vertical cross section view of a moving bed reactor showing the formation of a metal coating on a substrate by the decomposition of one or more reactive intermediates formed by reacting one or more metal reactants with a halogen-containing reactant.

The invention provides a novel low temperature process for forming a powder or a coating comprising one or more metals or metal compounds by reacting the one or more metals with a halide-containing reactant in a moving bed reactor to form one or more reactive intermediates capable of forming a coating or powder. The coating or powder may comprise one or more decomposition products of the one or more reactive intermediates comprising the one or more metals initially reacted with the halide-containing reactant.

Alternatively, the coating or powder may comprise the reaction product of the one or more reactive intermediates reacted with another reactant introduced into a second reaction zone of the reactor and selected from the class consisting of a boron-containing reactant, a carbon-containing reactant, a nitrogen-containing reactant, an oxygen-containing reactant, and mixtures thereof to form the powder or coating which comprises, respectively, one or more metal borides, metal carbides, metal nitrides, metal oxides, or a mixture thereof, of the one or more metal reactants depending upon the other reactant.

While the foregoing formations of either coatings or powders of either the initial one or more metal reactants or reaction products containing the one or more metal reactants as borides, carbides, nitrides, oxides, or mixtures thereof will be described separately below for purposes of clarity, it must be noted that the gravamen of the invention is the initial reaction of the one or more metal reactants with the halide-containing reactant at atmospheric pressure and at a low temperature to form one or more reactive intermediates. This low temperature formation of the reactive intermediates makes possible the subsequent low temperature formation of the powders or coatings.

By the use of the term "low temperature" herein to describe the initial reaction between the one or more metal reactants with the halide-containing reactant is meant a temperature ranging from about 200° C., but no higher than about 1000° C. A preferable range for this reaction is from about 400° C. to about 800° C., but the term "low temperature", when used herein without further definition of the temperature, will be understood to mean the broader range of from about 200° C. to about 1000° C.

The use of the term "low temperature" to describe the reaction in a second zone of the reactor used in forming either the powder or coating comprising the boride, nitride, carbide, oxide, or mixture of the one or more metal reactants is intended to define a temperature range of from about room temperature, i.e., 20°-25° C. to about 1300° C. The temperature in this second zone preferably ranges from about 600° to about 900° C.

This temperature range may be maintained within the one or more reaction zones within the reactor by any convenient heating means such as resistance heating, RF heating, microwave heating, radiation heating, laser heating, arc heating, or gas heating.

The one or more metal reactants which are reacted with the halide-containing reactant may comprise any metal or metals capable of reacting with a halide-containing reactant to form one or more metal halide intermediates, regardless of the instability of the reaction intermediate. Such metals include the transition metals Ti, V, Cr, Zr, Nb, Mo, Hf, Ta, and W, as well as Al, Si and B. While it is recognized that silicon and boron are not technically considered to be metals, the use of the terms "metal reactant" and/or "metal reactants" herein will be understood to include Si and B as well as those elements traditionally recognized as metals.

The metal reactant is preferably provided in particulate form comprising particles having a size of from about 100 to about 1000 microns. However, the metal reactant may also be provided in other forms such as foils and fibers and other shapes which provide dispersions with large surface to volume ratios. The metal reactant is reacted with the halide-containing reactant by placing the metal reactant powder in a moving bed reactor such as a fluidized bed reactor. An inert gas may be used to fluidize the bed or the powder may be rotated, moved by gravity, vibration, or any other suitable means which will move or agitate the particle bed. It should be noted in this regard that the particle bed itself comprising the moving bed in the reactor comprises the metal reactant in particulate form, not an inert material.

Figure 5:
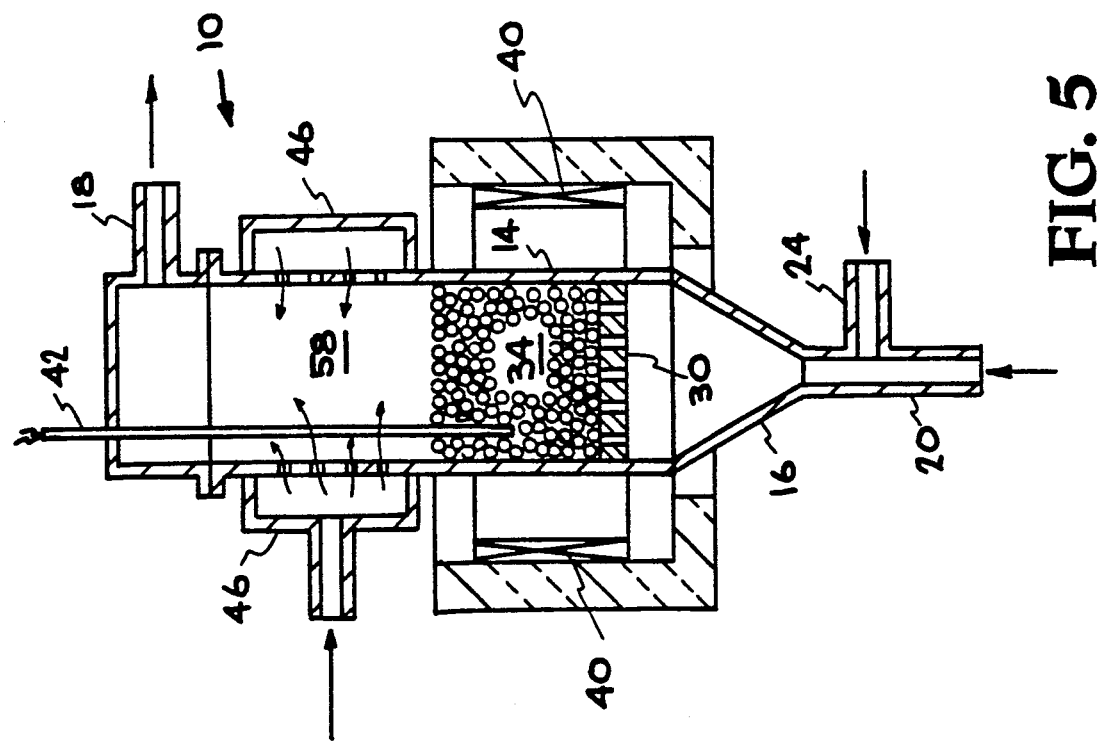
FIG. 5 is a vertical cross section view of a moving bed reactor showing the production of metal powder from the decomposition of one or more reactive intermediates formed by reacting one or more metal reactants with a halogen-containing reactant.
Figure 11:
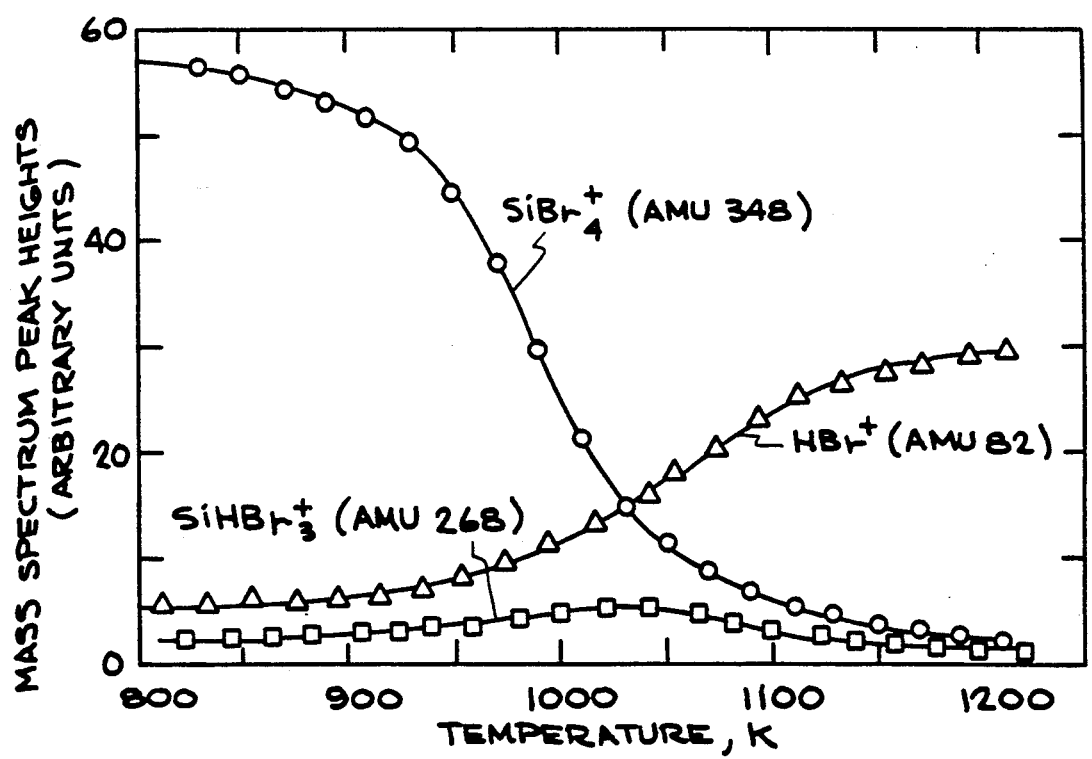
FIG. 11 is a graph showing the mass spectrum obtained when mixtures of $H_2/SiBr_4$ are passed through silicon powder Br/H=0.0063.
Figure 12:
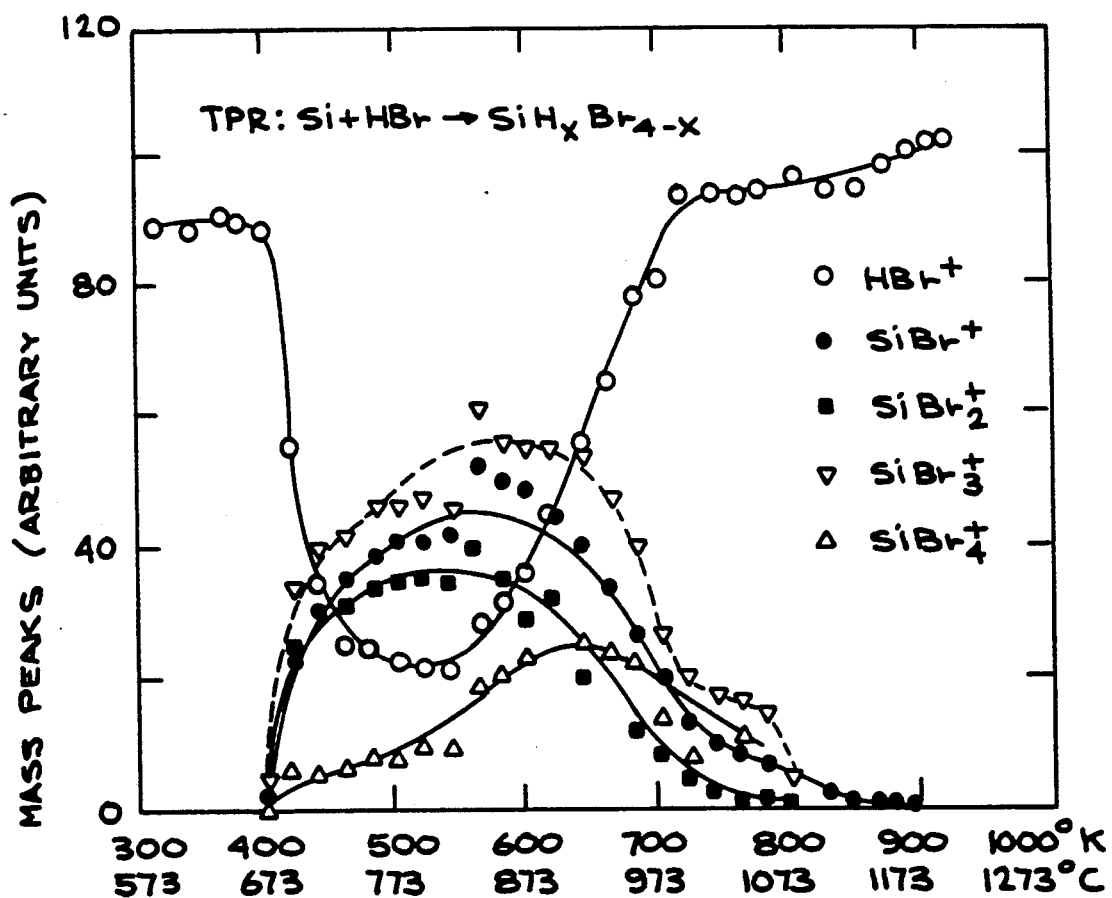
FIG. 12 is a graph showing the mass spectrum of species in the Si-H-Br system obtained when HBr is passed through silicon powder.

The reactor may comprise any suitable non-reactive containment vessel capable of containing a moving bed such as, for example, a fluidized bed. A suitable containment vessel, for example, would be a quartz cylinder. The walls of the reactor are kept hotter than the bed to inhibit deposition on the walls. As shown in FIG. 5, by way of example, a fluidized bed reactor 10 may comprise a cylindrical vessel 14 having an exit port 18 and a tapered lower portion 16 into which an inert fluidizing gas enters through a first port 20 and is mixed with the halogen-containing reactant in gaseous form which enters tapered portion 16 through a second port 24.

The gaseous mixture then enters a first reaction zone 34 through a distribution plate 30 located just above tapered portion 16 in reactor 10. Above distribution plate 30 is located, in first reaction zone 34, the bed of particles comprising the one or more metal reactants, e.g., titanium particles. Around the outside walls of reactor 10 is placed a heating means 40 which may, for example, comprise a tubular resistance furnace which cooperates with thermocouple temperature sensor 42 to maintain first reaction zone 34 in reactor 10 within the temperature range of from about 200° C. to about 800° C. When the fluidizing gas mixture containing the halogen-containing reactant enters first reaction zone 34 through distribution plate 30, the metal reactant particles are both fluidized and brought into intimate contact with the one or more metal reactants to thereby form the one or more reactive intermediates.

As will be further described below, these reactive intermediates then either form the powder or a coating deposited on a substrate; or pass on into a second reaction zone to react with a third reactant to form the powders or coatings of metal nitrides, metal carbides, or metal borides, or mixtures thereof as will also be described below.

The reaction time, or residence time needed in the first reaction zone for the one or more metal reactants to react with the halogen-containing reactant to form the reactive intermediate varies from about 0.1 seconds up to 100 minutes, preferably about 1 second to about 100 seconds.

When a coating is to be formed on a substrate, either comprising a metal coating formed by decomposition of the one or more reactive intermediates formed by reaction between the one or more metal reactants and the halogen-containing reactant, or by a reaction between the one or more reactive intermediates and a third reactant to form one or more metal compounds, as will be described below, the substrate may comprise any material capable of withstanding the temperatures which will be used in the reactor to form the coating. Thus, most metals or ceramic materials, for example, will be suitable substrate materials on which the coating may be deposited. Examples of other suitable substrate materials include metals such as Cu, Ni, Fe, alloys such as steels, super alloys, monolithic ceramics such as $Al_2O_3$, $ZrO_2$, $SiO_2$, SiC, $Si_3N_4$, TiN, etc., or fibers, whiskers, or powders of any of the above, or composites thereof.

The halide-containing reactant is a gaseous reactant which comprises one or more reactants containing one or more of the halides selected from the class consisting of F, Cl, Br, and I. Included in the definition of halide-containing reactants are compounds having the formula $X_2$, HX, $MX_a$, or $MX_{(a-b)}H_b$ where X is F, Cl, Br, or I; M is one or more metals selected from the class consisting of any of the metal reactants and Pb; a is the maximum oxidation state or valence of the metal M; and b has a value of from 1 to $a-1$.

By use of the term "gaseous" is meant that the halogen-containing reactant is introduced into the first reaction zone as a gas or a vapor at the temperature of operation. When the halogen-containing reactant is a vapor, for example, it may be introduced into the first reaction zone with a carrier gas.

It should be noted that when more than one metal reactant is to be used, either to form a powder or coating alloy, or to form a mixture of nitrides, carbides, oxides, and/or borides, as will be described below, all of the metal reactants may be present as particles or one or more of the metal reactants may be introduced into the reaction zone in the form of the fluidized particles, while one or more other metal reactants may form a part of the gaseous halogen-containing reactant, if desired.

When another reactant is added to a second reaction zone in the reactor to react with the reactive intermediate formed in the first zone to thereby form a nitride, carbide, oxide, or boride of the one or more metal reactants or a mixture of such compounds; the additional reactant may comprise a nitrogen, carbon, oxygen, or boron source, respectively, (or mixture of same when a mixed nitride, carbide, oxide, or boride is desired) which is in the gaseous state at the reaction pressure and temperature.

The reaction time in the second reaction zone needed for the one or more reactive intermediates to react with the third reactant to form a nitride, carbide, oxide, or boride of the one or more metal reactants or a mixture of such compounds, in the form of a powder deposit or a deposit of a coating on a suitable substrate, varies from about $10^{-16}$ seconds to about 100 seconds, preferably about $10^{-6}$ seconds to about 10 seconds.

When a nitride is to be formed, the nitrogen source, for example, may comprise $N_2$, or an ammonia or hydrazine reactant having the formula $N_nH_{(n+m)}$ where $n=1-4$, and $m=2$ when the nitrogen-hydrogen reactant is a straight chain and 0 when the nitrogen-hydrogen reactant is cyclic.

When a carbide is desired, the additional reactant may be any 1–20 carbon hydrocarbon containing hydrogen and carbon such as, for example, methane, ethane, ethene, ethyne, propane, propene, propyne, butane, 1-butene, and 1-butyne, which will be gaseous at the reaction temperature.

When a boride is desired, the additional reactant may be any boron-containing material which contains only boron and hydrogen or other materials already present in the first reaction zone such as a halide. Preferably, the source of boron will be a borane such as diborane ($B_2H_6$).

It must be further noted that if it is desired to form a mixture of nitrides, carbides, oxides, and borides, in any combination, then the nitrogen, carbon, oxygen, and boron sources which may be used as the additional reactant may be greatly expanded, subject to the provisions discussed above with regard to the gaseous state of the reactant. For example, any organic material containing only carbon, hydrogen, and nitrogen may be used as the additional reactant when it is desired to form a mixture of at least one carbide and at least one nitride; while organic sources containing carbon, hydrogen and boron may be used to form mixtures containing at least one carbide and at least one boride.

In addition, mixtures of more than one additional reactant may be used, either to form solely a nitride, carbide, oxide, or boride, or, as will more likely be the case, to form various mixtures of nitrides, carbides, oxides, and borides.

The initial formation of one or more reactive intermediates from the reaction between the metal reactant and the halogen-containing reactant is believed to form unstable intermediates which may then, in turn, either react with another reactant such as the nitrogen, carbon, oxygen, or boron-containing reactants discussed above to respectively form a nitride, carbide, oxide, or boride; or decompose to permit formation of a coating or powder consisting essentially of the initial metal reactant or reactants.

By way of illustration, and not of limitation, for example, when the metal reactant is silicon and the halide-containing reactant is bromine, the silicon may react with the bromine according to the following equation:

$$Si + 2\ Br_2 \rightarrow SiBr_4$$

The $SiBr_4$ may, in turn, then further react with the silicon present in the reactor to form equilibriums of the following species:

$$3\ SiBr_4 + Si <=> 4\ SiBr_3$$

$$SiBr_4 + Si <=> 2\ SiBr_2$$

$$SiBr_4 + 3\ Si <=> 4\ SiBr$$

When $H_2$ is also present in the equilibrium, for example by the use of HBr as the halogen-containing reactant, then the following equations are also possible:

$$SiBr_4 + H_2 <=> Si + 4\ HBr$$

$$Si + 3\ HBr <=> SiHBr + H_2$$

$$Si + 2\ HBr <=> SiH_2Br_2$$

$$Si + 3 HBr <=> SiH_3Br + Br_2$$

Some of these subhalide and halosilane species are very reactive and it is believed that they either decompose to form a powder deposit or a coating, if a coatable substrate is present, of the metal reactant, e.g., silicon; or, if another reactant is then introduced into the reactor, these unstable subhalide species react with the additional reactant, e.g., $NH_3$ to form a powder or coating comprising the reaction product of the metal reactant and the other reactant, e.g., the formation of $Si_3N_4$ by reaction of one or more of the reactive silicon-containing intermediate subhalide species with $NH_3$.

I. Formation of Metal Powder

When it is desired to form a metal powder consisting of the one or more metal reactants in the particle bed, the halogen-containing reactant is merely passed through the bed of metal reactant particles in the first reaction zone while maintaining this reaction zone at from about 200° C. to about 1000° C., preferably from about 400° C. to about 800° C., for a period of from about 0.01 to about 100 minutes as shown in the apparatus in FIG. 5.

The one or more metal reactants react with the halogen-containing reactant to form the one or more reactive intermediates, as discussed above, which then react or disproportionate to form a powder of the one or more metal reactants. This step may take place in a cooler zone 58 which may be provided by a cold solid or a liquid substrate or, as shown in FIG. 5, by a stream of cold gas flowing into cool zone 58 of reactor 10 through a plenum 46. The average temperature in cool zone 58 may be 50° C. or more below that of first reaction zone 34.

The two zones may be part of the same chamber as shown in FIG. 5 wherein the fluidized bed constitutes first reaction zone 34 and the space above it constitutes cooling zone 58 which is cooled by adding a cold gas through the walls of the reactor above the bed. The powder product be then be formed in this cooler zone 58 and then entrained in the gas flowing out of reactor 10 through outlet 18 for collection outside of reactor 10.

When more than a single metal reactant is used, either in the particle bed or in the particle bed in combination with one or more metal reactants in the halogen-containing reactant, the resulting metal powder will be an alloy of the metal reactants with the ratio of the constituents of the alloy proportional to the ratio of the metal reactants in the reaction zone.

The resultant powder is a pure and ultrafine metal powder, typically having a particle size of from about 100 Angstroms to about 10 microns. This powder is light enough to pass out of the reactor entrained with the gas used to form the moving bed.

When more than one metal reactant is present, fine powder metal alloys are produced at relatively low temperatures. For example, a titanium/aluminum alloy powder may be formed when titanium and aluminum are both used as metal reactants. It should be noted that, in contrast to the prior art, the present process operates at atmospheric pressure, i.e., vacuum conditions are not needed.

II. Formation of Metal Coating

As shown in FIG. 6, when it is desired to form a coating of one or more metal reactants on a substrate, the substrate to be coated may be placed in the reaction zone and, as the reaction between the one or more metal reactants and the halogen-containing reactant proceeds, the one or more reactive intermediates formed in this reaction will decompose and the resulting metal or metals will form a coating on the substrate.

Coatings are obtained on substrates placed inside the particle bed and immediately above it, i.e., less than 5 cm. above the bed. In some cases, i.e., deposition of silicon or titanium on steel, the substrate temperature may be 50° C. higher than the bed with the rate of deposition increasing with temperature differences reaching a maximum for temperature differences of about 200° C. This value, however, may change with the chemical system and reactor design, and is, therefore, given only for illustration purposes.

Coatings can also be obtained on substrates located immediately above the bed and maintained at temperatures below that of the bed, typically 50° C., but as much as 200° C. lower than the bed temperature.

Finally, coatings can be obtained in some cases even when the bed and the substrate are kept at the same temperature. For example, silicon can be coated on copper when both the bed and the substrate are kept at about 600° C. Silicon deposits and diffuses in the copper thus decreasing the silicon activity. The gas phase in the bed acts as a transport agent for silicon from the bed with silicon activity of 1. In this mode, the driving force is the partial chemical gradient due to activity differences rather than temperature differences.

In the illustrated embodiment shown in FIG. 6, copper tubes 50 are shown suspended in first reaction zone 34 where they are coated with the one or more metal reactants. In specific examples, using apparatus similar to that shown in FIG. 6, copper, steel, and silica substrates were coated respectively with silicon (copper substrate), titanium (copper, steel, and silica substrates) and zirconium (steel substrate) as shown in the table below.

TABLE I

| Substrate | Coating | Temp (°C.) | Time (min) | Remarks |
|---|---|---|---|---|
| Cu | Si | 750 | 120 | totally siliconized |
| Cu | Si | 600 | 15 | very thin |
| Cu | Si | 600 | 37 | excellent |
| Cu | Ti | 750 | 45 | excellent |
| Steel | Ti | 750 | 45 | good, TiC* interface |
| Silica | Ti | 750 | 45 | good |
| Steel | Zr | 900 | 120 | ZrC* interface |

*Carbon initially present in the steel

III. Formation of Powder of Metal Compound

As shown in FIG. 7, the one or more reactive intermediates formed in first reaction zone 34 may pass upward in the reactor into a second reaction zone 60 above the particle bed comprising first reactive zone 34 where a third reactant, comprising a material as previously described, which is introduced therein through an inlet port 70, contacts the one or more reactive intermediates to form, respectively, one or more metal nitrides, carbides, oxides, borides, or mixtures of same, depending upon whether the third reactant contains nitrogen, carbon, oxygen, boron, or a mixture of same, as powders which are then passed out of the reactor through exit port 18 with the gases leaving reactor 10.

For example, silicon nitride (Si$_3$N$_4$) powder was produced by fluidizing 325 mesh silicon particles in a 5 cm ID 50 cm long fluidized bed reactor by an argon flow of 4 liters/min having a bed height (in repose) of 10 cm. The fluidized bed was heated externally to 600° C. for 1 hour, after which a flow of HBr gas was mixed with the argon fluidizing gas and coinjected into the bed as shown in FIG. 7. A flow of ammonia gas at a rate of 30-100 cm$^3$/min was fed through the top of the reactor so that the NH$_3$ and bromosilane reactive intermediates from the first reactive zone (the fluidized bed) mixed in the second reactive zone (the hot zone above the fluidized bed) which is kept at about 1000° C. A sample of white powder formed which was entrained with the fluidizing gas as it passed out of the reactor. Analysis of this white powder by x-ray diffraction showed that it contained a mixture of Si$_3$N$_4$ and silicon.

IV. Formation of Coating of Metal Compound

FIGS. 8 and 9 show, respectively, formation of coatings of metal compounds on a substrate in the second reaction zone in the reactor. In FIG. 8, a first plug 80 of graphite fibers is inserted into reactor 10 just above first reaction zone 34 and a second plug 82 of graphite fibers is also inserted into reactor 10 a spaced distance from first plug 80 forming a second reaction zone 60' commencing with the bottom of first plug 80 and extending upward through second plug 82. When a third reactant, comprising a material as previously described, is introduced therein through an inlet port 70, as in FIG. 7, and contacts the one or more reactive intermediates, a coating is formed on at least the first plug 80 of graphite fibers comprising, respectively, one or more metal nitrides, carbides, borides, oxides, or mixtures of same, depending upon whether the third reactant contains nitrogen, carbon, oxygen, boron, or a mixture of same.

To illustrate the formation of a metal coating on a substrate, a fluidized bed of 325 mesh silicon particles was formed in the reactor of FIG. 8 by fluidizing the bed with nitrogen gas after preheating the reactor bed to about 600° C. HBr was mixed with the fluidizing gas as the halogen-containing reactant. NH$_3$ was then injected through the upper graphite plug into the second reaction zone comprising the space above the fluidized bed. The resulting bromosilanes and subbromides formed in the first reaction zone (the fluidized bed) reacted with the NH$_3$ in the second reaction zone which was maintained at about 1200° C. The process was allowed to proceed for 2.5 hours after which the process was stopped and the lower graphite plug removed for analysis. The hard grayish brittle coating on the carbon fibers was studied using both scanning electron microscopy (SEM) and energy dispersive x-ray analysis (EDAX) which confirmed the presence of a Si$_3$N$_4$ coating on the carbon fibers.

In FIG. 9, substrates 50 are shown suspended in second reaction zone 60 above reaction zone 34 and a third reactant is injected into this second zone, similarly to that shown in FIGS. 7 and 8, where it contacts the one or more reactive intermediates rising from first reaction zone 34 to form a coating on the suspended substrate comprising, respectively, one or more metal nitrides, carbides, oxides, borides, or mixtures of same, depending upon whether the third reactant contains nitrogen, carbon, oxygen, boron, or a mixture of same.

To further illustrate the formation of a coating of a metal compound on a substrate such as shown in FIG. 9, a bed of 325 mesh titanium particles was formed and preheated to 750° C. prior to being fluidized by a flow of argon gas at atmospheric pressure. HBr gas was then mixed with the argon fluidizing gas to obtain a partial pressure of 7 torr. Steel and silica substrates were suspended in the second reaction zone above the bed and a flow of NH$_3$ gas was injected into this zone from the top of the reactor while maintaining this second reaction zone at a temperature of 800° C.

Gold colored coatings were formed on the substrates and these coatings were confirmed by subsequent x-ray diffraction, SEM, and EDAX to be TiN. The coated steel substrate was tested for corrosion resistance in aqueous chloride solutions and found to have an increase in corrosion resistance of approximately 30 times that of uncoated steel.

Thus, the invention provides a novel process for the formation of powders or coatings of either one or more metal reactants powders in a moving bed reactor initially reacted with a halogen-containing reactant to form reactive intermediates which disproportionate or decompose to form the metal powder or coating; or which reactive intermediates may react further with another reactant introduced into a second reaction zone to form one or more metal compounds in the form of either a powder or a coating.

Having thus described the invention, what is claimed is:

1. A low temperature process for forming a powder comprising one or more metals compounds which comprises:
    (a) reacting one or more metal reactants selected from the class consisting of Al, Ti, V, Cr, Zr, Nb, Mo, Hf, Ta, W, and Si with a halide-containing reactant selected from the class consisting of X$_2$, HX, MX$_a$, or MX$_{(a-b)}$H$_b$ where X is F, Cl, Br, or I; M is one or more metals selected from the class consisting of said metal reactants and Pb; a is the maximum oxidation state or valence of said one or more metals M; and b has a value of from 1 to a−1, in a first reaction zone in a reactor comprising a fluidized bed to form one or more reactive intermediates capable of forming a powder; and
    (b) contacting, in a second reaction zone spaced from said first reaction zone in said reactor, said one or more reactive intermediates formed in said first reaction zone with a third reactant, which third reactant is introduced into said reactor at said second zone, and which is different from said halide-containing reactant, and which is selected from the class consisting of a carbon-containing reactant, an oxygen-containing reactant, a nitrogen-containing reactant, and mixtures thereof to form said powder comprising respectively, one or more metal carbides, metal oxides, metal nitrides, or a mixture thereof, of said one or more metal reactants.

2. The low temperature process for forming a metal compound powder of claim 1 which further comprises maintaining said first reaction zone in said reactor at a temperature within a range of from about 200° C. to about 1000° C.

3. The low temperature process for forming a metal compound powder of claim 1 which further comprises maintaining said second reaction zone in said reactor within a range of from about 500° C. to about 1300° C.

4. A low temperature process for forming a powder comprising one or more metal compounds which comprises:

(a) reacting fluidized particles of one or more metal reactants, comprising a fluidized bed first reaction zone in a reactor, with a halide-containing reactant to form one or more reactive intermediates;

(b) passing said one or more reactive intermediates from said first reaction zone to a second reaction zone in said reactor spaced from said fluidized bed comprising said first reaction zone; and (c) contacting said one or more reactive intermediates in said second reaction zone with a third reactant introduced into said reactor at said second reaction zone and selected from the class consisting of a carbon-containing reactant, an oxygen-containing reactant, a nitrogen-containing reactant, and mixtures thereof to form said metal compound powder comprising respectively, one or more metal carbides, metal oxides, metal nitrides, or a mixture thereof.

5. A low temperature process for forming silicon nitride which comprises:

(a) reacting fluidized silicon particles, comprising a fluidized bed first reaction zone in a reactor, with a halide-containing reactant to form one or more reactive intermediates in said first reaction zone;

(b) passing said one or more reactive intermediates from said first reaction zone to a second reaction zone in said reactor spaced from said fluidized bed comprising said first reaction zone; and (c) contacting said one or more reactive intermediates in said second reaction zone with a nitrogen-containing reactant to form silicon nitride powder in said second reaction zone.

6. The method of claim 5 wherein said step of reacting said silicon particles with a halide-containing reactant to form said one or more reactive intermediates further comprises reacting said silicon particles with HBr gas in said first reaction zone to form said one or more reactive intermediates.

7. The method of claim 6 wherein said step of contacting said one or more reactive intermediates in said second reaction zone with a nitrogen-containing reactant to form silicon nitride powder in said second reaction zone further comprises contacting said one or more reactive intermediates with ammonia gas to form said silicon nitride powder.

* * * * *